United States Patent [19]

Witczak

[11] Patent Number: 4,533,867
[45] Date of Patent: Aug. 6, 1985

[54] METHOD AND APPARATUS FOR MEASURING HIGH FREQUENCY SIGNALS

[75] Inventor: Edward J. Witczak, Santa Clara, Calif.

[73] Assignee: EIP Microwave, Incorporated, San Jose, Calif.

[21] Appl. No.: 410,798

[22] Filed: Aug. 23, 1982

[51] Int. Cl.³ ............................................. G01R 23/02
[52] U.S. Cl. ................ 324/78 R; 324/79 D; 324/83 D
[58] Field of Search ............... 324/77 B, 78 R, 78 D, 324/79 R, 79 D, 83 D; 328/133, 136; 307/479; 364/484; 455/323

[56] References Cited

U.S. PATENT DOCUMENTS 3,450,991  6/1969  Hornoch ........................ 324/79 D
3,919,706 11/1975  Grimm ........................... 324/83 D
4,123,704 10/1978  Johnson .......................... 324/78 D Primary Examiner—Michael J. Tokar
Attorney, Agent, or Firm—Nilsson, Robbins, Dalgarn, Berlinger, Carson & Wurst

[57] ABSTRACT

A method and associated apparatus for accurately determining the frequency of signals in the Gigahertz range. The signal is gated and applied to a conventional prescaler, producing an output signal whose frequency is a whole number fraction of the input. The frequency of the prescaler output is counted and the count stored. The output of the prescaler initiates the application of clocking pulses to the prescaler sufficient in number to complete the count of the prescaler. The number of pulses required is counted and combined with the stored count of the prescaler to produce an accurate measure of the frequency of the signal.

17 Claims, 16 Drawing Figures

METHOD AND APPARATUS FOR MEASURING HIGH FREQUENCY SIGNALS

BACKGROUND TO THE INVENTION

1. Field of the Invention

The present invention pertains to methods and apparatus for accurately determining the frequency of signals in the Gigahertz range. More specifically, this invention relates to methods and apparatus for determining the residual count of a prescaler of the type frequently employed in conjunction with a direct counter.

2. Description of the Prior Art

Digital methods and apparatus for measuring high frequency signals (i.e. above 500 MHz) are hindered by the inability of present day counters to accept and produce an accurate indication of frequency. To overcome this inherent problem, high speed discrete logic, prescaler operations and down converting (or heterodyning) of the input signal to an intermediate frequency have been employed to convert the frequency of the input signal to one compatible with the capabilities of the direct counter.

Each of the aforementioned techniques possesses unique advantages and suffers peculiar disabilities with respect to the measurement of signal frequencies. Systems employing high speed discrete logic often utilize a considerable number of components, commonly rendering such systems undesirable from either a cost or a reliability viewpoint. The mixing of an unknown frequency with a known frequency in a typical heterodyning operation possesses inherent disadvantages occasioned by drift, temperature instability and the like.

Prescaling operations reduce the frequency of the unknown input signal by a known factor. The reduced frequency signal may then be applied to a direct counter which counts the number of cycles of the "prescaled" signal. The actual frequency of the input signal may then be determined by multiplying the measured count by the divide ratio of the prescaler. The prescaler apparatus often comprises a chain of bistable logic elements, certain of the outputs of which are gated through conventional logic elements to produce an output comprising a single pulse representative of a preselected number of input pulses (after proper condition of the input signal, if analog). Examples of prescaling apparatus include the SP8665D, SP8666B and SP8667B decade counters manufactured by Plessey Semiconductors of Irvine, Calif. Each of these UHF counters produces a single output pulse for every 10 pulses of the input signal.

The accuracy of frequency measurement wherein a prescaler operation is employed is often hindered by the existence of "residual" counts in the prescaler. Such residue is occasioned by the fact that a finite segment of the unknown signal comprising a number of pulses is gated into the prescaler and, unless such segment contains pulses comprising a whole number multiple of the prescaler divide ratio, only a portion of the frequency information applied to the prescaler will be passed to the direct counter. Manufacturing and operational considerations relating to reliability and stability have precluded the manufacture of prescalers with parallel outputs for use above about 700 MHz, leaving such delay-inducing techniques as extending the duration of the gate to the time equivalent of the predetermined prescaler divide ratio.

SUMMARY OF THE INVENTION

The present invention overcomes the above stated difficulties which have hindered the accurate measurement of high frequency signals by providing an improved method and apparatus for frequency measurement. The method includes the step of applying the signal to a prescaler to produce an output signal. The frequency of the output signal is then counted and stored. A sufficient number of clocking pulses is then applied to the prescaler to complete the count of such device and the number of clocking pulses so utilized is counted and stored. The frequency of the output signal from the prescaler is then combined with the number of clocking pulses to produce an accurate measure of signal frequency. In a further aspect, the present invention provides a method for deriving the residual count of a prescaler that comprises the steps of applying a sufficient number of clocking pulses to complete the count of the prescaler and counting the number of such clocking pulses.

In an additional aspect, the present invention comprises apparatus for measuring the frequency of a signal. The apparatus includes a prescaler to accept the signal and to produce an output in response thereto. A first counter is adapted to receive the output signal from the prescaler. Means are provided for storing the count of the first counter and for applying a sufficient number of clocking pulses to the prescaler to complete the count of said device. A second counter is adapted to receive these clocking pulses. Means are provided for storing the count of the second counter and for combining the count of the first counter and the second counter to produce an accurate measure of the frequency of the signal.

These and other aspects and advantages of the present invention are disclosed in the following detailed description wherein like numerals refer to like features throughout.

DETAILED DESCRIPTION

Figure 1:
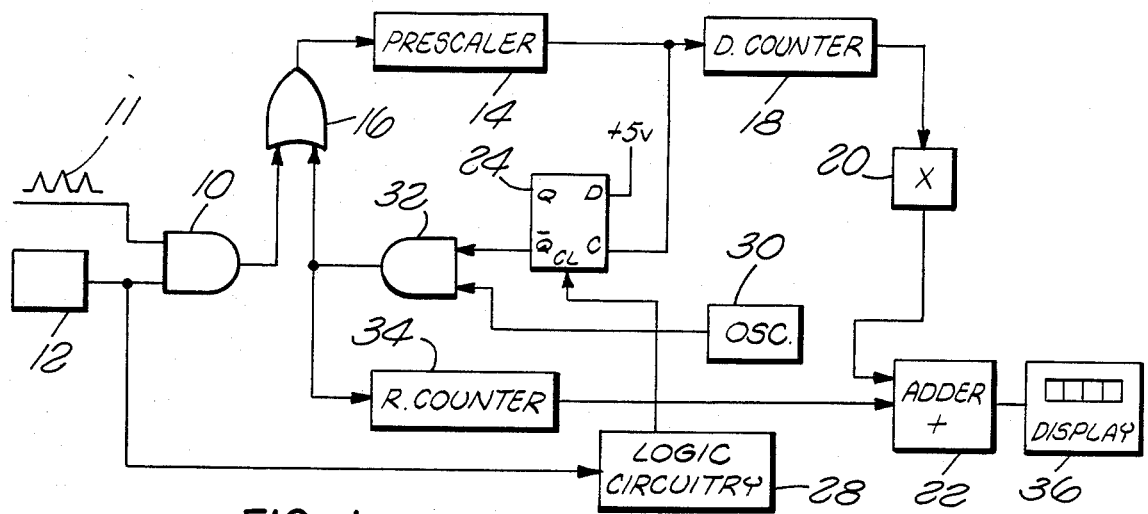
FIG. 1 is a system schematic view of the present invention in accordance with a preferred hard wired embodiment thereof.

FIG. 1 is an electrical schematic view of a frequency measuring system according to the present invention. The embodiment of FIG. 1 employs a hard wired arrangement of conventional logic elements comprising apparatus for practicing the present invention. An alternative embodiment will be disclosed, infra, employing a microprocessor to centralize a number of the operations required for the practice of the present invention.

The system of FIG. 1 includes a dual input AND gate 10 for accepting a signal 11 of unknown frequency (after conventional preliminary wave shaping operations, if necessary) and a gating signal generated by monostable element 12 (which may comprise a one shot and associated circuitry) to produce as its output a "window" or finite segment of the signal 11 which is then applied to a prescaler 14 after passing through an OR gate 16. The dual inputs of the OR gate 16 provide a circuit junction point through which gated clocking pulses also may pass to the prescaler 14, the pulses serving to measure the residual count thereof by completing the counting cycle of the device. This process and the process by which the gated clocking signal is generated form essential features of the invention which will be discussed more fully below.

The prescaler 14 reduces the frequency of the input signal to a fraction N thereof, producing as its output a signal whose frequency may be counted directly by a relatively low speed counter 18. The counter 18 preferably includes latching means for retaining the count until it is to be read out. Readout may be initiated by receipt of an appropriate signal that is coordinated with the gating output of the monostable element 12 to thereby assure that the complete window is counted before the resultant data is read from the counter 18. The count stored or latched within the counter 18 represents, incompletely as will be seen, the number of pulses within the window applied to the prescaler 14 divided by the divide ratio N of the prescaler. After readout, the count is then applied to a multiplier 20 wherein the number representing the count is multiplied by N to "rescale" the frequency before application to an adder 22 wherein the residual count of the prescaler (discussed infra) is added thereto.

The output signal from the prescaler 14 clocks a D-type flip flop 24, the D input port of which is tied to +5 volts, the "high" logic state of the system. The clear terminal of the flip flop 24 accepts a signal generated by conventional logic circuitry 28, the design of which will become readily apparent to those skilled in the art from the following discussion of the operation of the invention.

The $\overline{Q}$ output of the flip flop 24 and a relatively low frequency clocking signal generated by an oscillator 30 are applied as inputs to an AND gate 32. The flip flop 24, the logic circuitry 28, the oscillator 30 and the AND gate 32 interact to provide a gated signal for driving the prescaler 14 to a "complete cycle" condition whereby the residual count thereof may be determined. The subsystem as just defined drives the prescaler 14 to such state or condition by applying successive clocking pulses thereto until the system detects the completion of the prescaler cycle (i.e. that N pulses have been applied to the prescaler 14.)

The number of clocking pulses applied to the prescaler 14 through the OR gate 16 is counted by a low speed residual counter 34 that is in electrical connection with the output of the AND gate 32. As in the instance of the counter 18, the residual counter 34 preferably includes a latching function for retaining the count until triggered by a readout signal that may be generated in response to the output of the AND gate 32. Upon the actuation of an appropriate readout signal, the count, representing the number of clocking pulses generated by the subsystem including the flip flop 24, the logic circuitry 28, the oscillator 30 and the AND gate 32, is applied to the adder 22 wherein N-times the count of the counter 18 is added to the residual count of the prescaler 14 as measured by the residual counter 34 and applied to conventional utilization and readout display device 36 to display and/or otherwise utilize the frequency of the input signal 11.

Figure 2:
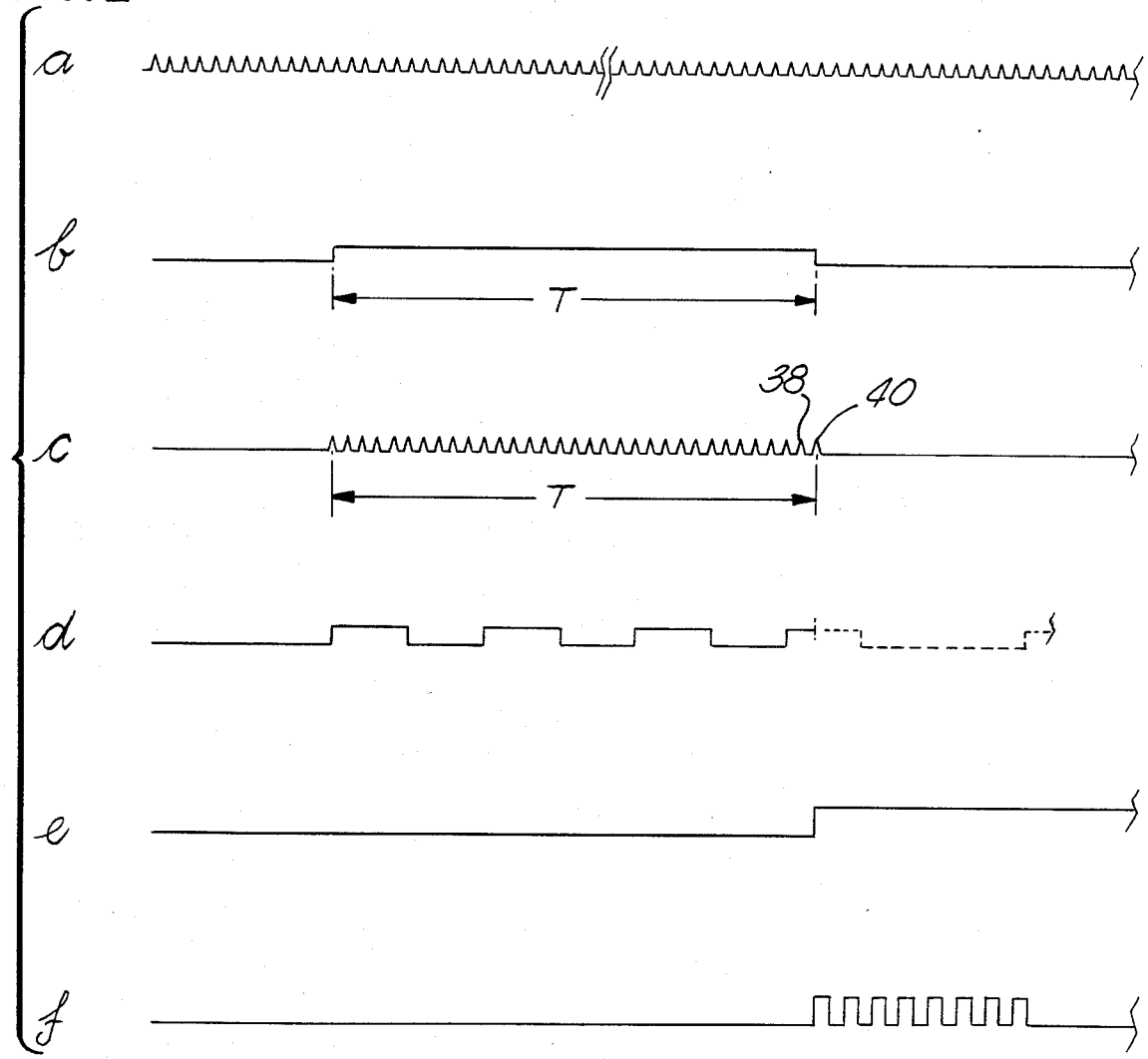
FIGS. 2a through 2f disclose a series of waveforms illustrating the operation and method of the present invention with reference to the embodiment of FIG. 1.

FIGS. 2a through 2f present a series of timing diagrams that illustrate the mode of operation of the apparatus of FIG. 1 and thereby disclose in further detail the method of the present invention. FIG. 2a represents the signal 11 of unknown frequency that is to be measured. As shown in FIG. 2a, the signal comprises a series of pulses. In the event that the signal to be measured is not of pulsed form (e.g. sinusoidal), it may be reduced to the form shown in FIG. 2a by means of conventional waveshaping techniques and circuitry therefor, including rectifiers and the like, all of which are well known to those skilled in the art.

FIG. 2b represents the output of the monostable element 12, a pulsed signal having pulse duration T. As FIG. 2c shows, a window of the input signal of width T is derived as the output of the AND gate 10. The system of the invention determines the frequency of the input signal by counting the cycles thereof within the representative window. As can be seen in FIG. 2c, a total of 32 pulses are included within the window of the input signal. Such a number has been chosen for ease of illustration only and, of course, is an unrealistically low number of pulses, assuming a conventional monostable element 12 is utilized, in light of the Gigahertz range frequencies that the system of the invention is designed to measure.

The prescaler 14 may be a decade counter of the conventional type such as one of the above referenced SP 8000 Series high speed dividers manufactured by Plessey Semiconductors, Inc. Accordingly, by applying the signal "window" of FIG. 2c through the OR gate 16 as a clock input to the prescaler 14, the prescaler output waveform of FIG. 2d is generated. The prescaler output is characterized by a cycle of alternating "high" (+5 volts) and "low" (ground) logic states of equal duration, each of such states existing for 5 counts of the input waveform. The output cycle of the prescaler 14 is thus completed upon the application of ten input pulses thereto and the output of the prescaler 14 is a pulsed signal whose frequency is one-tenth that of the input signal.

The signal of FIG. 2d, including three "full" pulses and a fourth pulse of lesser duration produces a count of "three" when applied to the counter 18. The count latched or stored within the counter 18 does not contain sufficient information to reconstruct the exact frequency of the signal applied to the prescaler 14. (If the counter 18 were alternatively of such a type as to count the pulse of fractional duration (i.e., triggered by the positive going edge of the input pulse) and produce a count of "four", an inexact count of the input signal frequency inherently introduced by the division of the input frequency for purposes of effecting a countable number of pulses, would still occur at the counter 18.) The present invention achieves an accurate count of the frequency of the input signal by not only counting the above-referenced output of the prescaler 14 but also evaluating the uncounted residue, represented by pulses 38 and 40 of the "window" of FIG. 2c, of the prescaler 14.

As discussed above, the output of the prescaler 14 shown in FIG. 2d is applied as a clocking signal to the flip flop 24 and the output of the logic circuitry 28 is applied to the clear port thereof. FIG. 2e is a waveform of the output of the logic circuitry 28. This waveform remains low until the output of the monostable element 12, which provides the gating pulse of FIG. 2b, returns to its low state. The return of the signal of FIG. 2b to the low state indicates that the gated signal segment of FIG. 2c has been applied to the prescaler 14. The flip flop 24 remains set as the pulses of the waveform of FIG. 2d are applied thereto since, as above-mentioned, the D port of the flip flop is tied to plus five volts. The set condition maintains the voltage level at the $\overline{Q}$ port of the flip flop at the "low" logic level, inhibiting the passage of clocking pulses from the oscillator 30 through the AND gate 32. Upon application of a "high" level signal from the logic circuitry 28 to the clear port of the flip flop 24, the flip flop is reset and the voltage level at $\overline{Q}$ is driven high. Thus, the change of state of the flip flop 24 renders the AND gate 32 conductive, allowing the clocking pulses from the oscillator 32 to pass therethrough.

The flip flop 24, in its reset state, will again set upon receipt of a positive going signal transition at its clocking port to once again drive $\overline{Q}$ low and inhibit the passage of pulses, via AND gate 32, to the prescaler 14. As can be seen from reference to FIG. 2d and the discussion accompanying that waveform, an upgoing transition in the output of the prescaler 14 signal the completion of a prescaler counting cycle and the start of the next cycle. That is, such transition coincides with the arrival of the Nth pulse of the cycle at the input of the prescaler 14.

FIG. 2f is the waveform of the output of AND gate 32. The $\overline{Q}$ output of the flip flop 24, as described above, provides a gating signal that regulates the passage of clocking pulses from the oscillator 30 through the AND gate 32. As can be seen, eight clocking pulses from the oscillator 30 pass through the AND gate 32 while the $\overline{Q}$ output of the flip flop 24 is "high"; that is, during the time interval initiated by the application of a high voltage level from the logic circuitry 28 to the clear port of the flip flop 24 and terminated by the arrival of the positive going edge of an output pulse from the prescaler 14 at the clock input of the flip flop 24.

For convenience, the residual counter 34 is assumed to be of a downcounting type which has been preset to N (i.e., a count of 10). Thus, upon the arrival of the eight clocking pulses, a count of "two" is stored or latched therein. As formerly disclosed, a count of "three" is latched within the counter 18. Upon readout, the latter count is multiplied (by a factor of 10) in the multiplier 20 and applied to the adder 22. Similarly, the count of "two" latched within the residual counter 34 is read directly into the adder 22. These numbers are summed by the adder 22 and applied to the conventional utilization and display device 36 wherein their sum, "32", may be read and/or otherwise employed.

Figure 3:
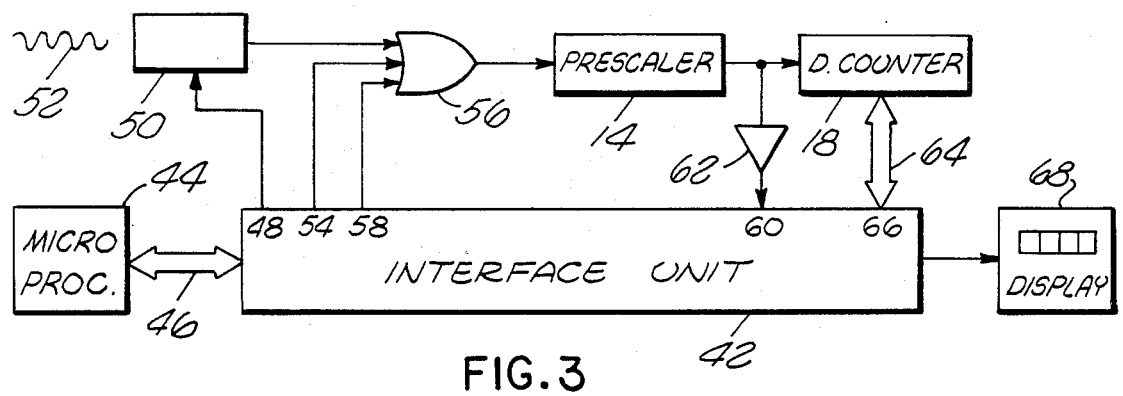
FIG. 3 is a system schematic view of the present invention in accordance with a preferred embodiment which incorporates microprocessor control.

FIG. 3 illustrates an alternative embodiment of the present invention wherein a number of the system's functions are accomplished by means of a programmable interface unit 42 which functions under the program control of a microprocessor 44. In an actual reduction to practice of the invention in accordance with the configuration of FIG. 3, the interface unit 42 comprised a Model 8255 Programmable Peripheral Interface and the microprocessor 44 comprised a Model 8088, each of which is manufactured by the Intel Corporation of Santa Clara, Calif.

Data and control are communicated between the microprocessor 44 and the interface unit 42 through a bus 46. Various ports of the interface unit 42 are thereby controlled to provide, through conductive coupling to various units of the system (discussed below), its essential control signals and to accept, store and process generated data. A port 48 of the interface unit provides a signal to conventional wave shaping circuitry 50 to thereby admit or prohibit the passage of an input signal 52 to the frequency measuring system as embodied in FIG. 3. Port 54 provides a downgoing gating signal to a three input OR gate 56. The other inputs to the OR gate 56 comprise the output of the waveshaping circuitry 50 and the signal at port 58 of the interface unit 42.

The signal at port 58 provides a series of clock pulses which enables the system to sequentially supplement the residual count of the prescaler 14 until its count cycle is completed in a manner similar to that in which pulses from the oscillator 30 effect the same purpose in the hard wired embodiment of FIG. 1. The output of the prescaler 14 is applied to the direct counter 18 and to an input port 60 of the interface unit 42 through a buffer 62 which compensates for line loading effects. The count of the direct counter 18 is entered, upon a command from the unit 42, at input port 66 of the unit 42 through a bi-directional bus 64. The number representing the frequency of the measured signal is then derived within the microprocessor 44 under the direction of conventional computer programming, the details of which will be readily apparent to those skilled in the art from the foregoing and the following discussions. The frequency as derived is thereafter applied to conventional peripheral display and utilization apparatus 68.

Figure 4:
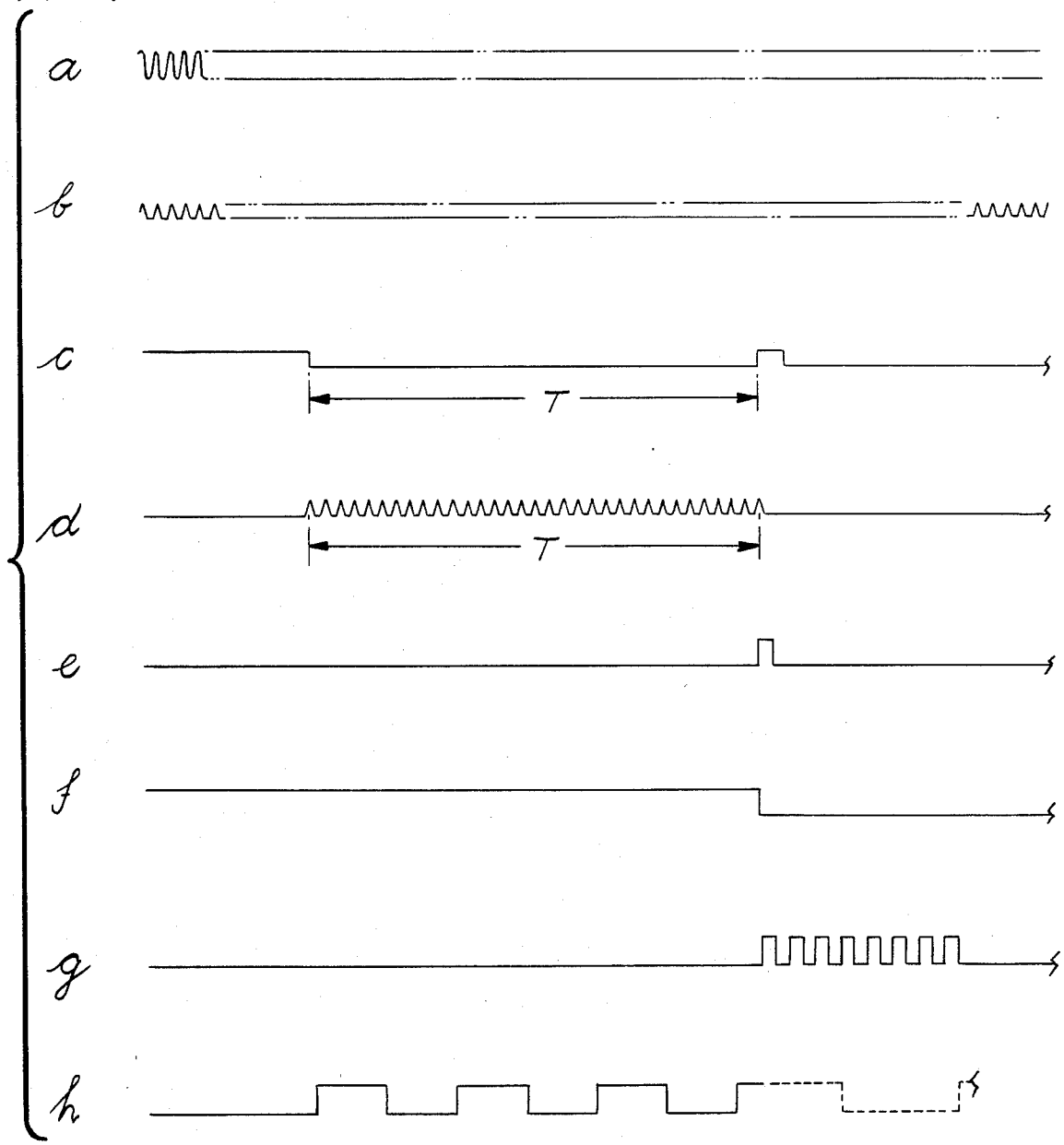
FIGS. 4a through 4h disclose a series of waveforms which illustrate the operation and method of the present invention with reference to the embodiment of FIG. 3.

The operation of the present invention according to the embodiment of FIG. 3 is disclosed with the aid of the series of waveforms shown in FIGS. 4a through 4h. FIG. 4a represents a sinusoidal R.F. signal 52 of unknown frequency. This signal, when applied to the waveshaping circuitry 50 emerges as the pulsed waveform of FIG. 4b. FIG. 4c discloses the waveform which is programmed to the port 54 under control of the microprocessor 44. This waveform provides a downgoing gating signal that is applied to the OR gate 56. FIG. 4d shows the output of the OR gate 56. As can be seen, a window of the input signal is generated by the embodiment of FIG. 3 which coincides with the downgoing portion T of the gating signal of FIG. 4c. This is to be contrasted with the embodiment of FIG. 1 wherein it is the positive going portion of the corresponding gating signal that generates the desired window.

FIG. 4e discloses the signal, a pulse, that is generated at the bidirectional port 66 of the interface unit 42. This signal, which occurs after the window of the input signal has been applied to the prescaler 14, activates latching circuitry within the direct counter 18 to "dump" the number stored therein, representing the count of pulses produced at the output of the prescaler 14, into an appropriate register within interface unit 42.

FIG. 4f, a waveform representing the signal at the port 48, undergoes a downward transition after the window has been applied to the prescaler 14. The low level signal thereby applied to the waveshaping circuitry 50 renders such circuitry nonconductive to the input signal 52 so that the pulsed waveform of FIG. 4b is no longer applied to the OR gate 56.

FIG. 4g represents the voltage profile of the port 58. The voltage is raised to a high level and, after the voltage at the gating port 54 has been lowered, control of the input waveform to the prescaler 14 is thereby transferred to the port 58. This port includes a toggling capability and once the control of the OR gate 56 has been transferred thereto, clocking pulses, produced by the toggling of the port, are sequentially applied to the OR gate 56 and are, in turn applied to the prescaler 14.

FIG. 4h is the waveform of the output of the prescaler 14, conditioned by means of the buffer 62, which is applied to the input port 60 of the interface unit 42. Each time the port 58 is toggled, a register within the interface unit, serving an analogous function to that of the residual counter of the embodiment of FIG. 1, is incremented. The port 58 will continue to toggle until directed, under program control, to cease. This instruction is received from the microprocessor 44 when an upgoing edge in the output of the prescaler 14 is detected at the input port 60 of the interface unit 42 and communicated to the microprocessor 44 through the bidirectional buss 46.

The contents of the two aforementioned internal registers of the interface unit 42, wherein the number of pulses counted by the direct counter 18 and the number of times port 58 has been toggled are stored, are combined under program control to produce an accurate count of the frequency of the input signal 11. This count may then be transmitted to the conventional peripheral display and utilization apparatus 68.

Thus it is seen that there has been brought to the frequency measurement art a new and improved method and apparatus for accurately determining the frequency of signals in the Gigahertz range. Utilizing the teachings herein, one may obtain the residual count of a prescaler without introducing time delays as a result of the extension of the gating time for generating a segment or "window" of the input signal.

Although the foregoing invention has been described in some detail by way of illustration and example, changes in form and substitution of equivalents are contemplated as circumstances may suggest or render expedient; and although specific terms have been employed herein, they are intended in a descriptive sense and not for purposes of limitation, the scope of the invention being delineated in the following claims.

What is claimed is:

1. A method for measuring the frequency of a signal comprising the steps of:
   (a) applying said signal to a prescaler to produce an output signal;
   (b) counting the frequency of said output signal;
   (c) storing the frequency of said output signal; then
   (d) applying a sufficient number of clocking pulses to said prescaler to complete the counting cycle of said prescaler;
   (e) counting the number of said clocking pulses;
   (f) storing said count; then
   (g) combining the frequency of said output signal with said count to derive an accurate measure of the frequency of said signal.

2. A method for measuring the frequency of a signal comprising:
   (a) applying said signal to a gate; and
   (b) applying a first control signal of predetermined duration to said gate so that a segment of said signal of predetermined duration is then applied to a prescaler to produce an output signal;
   (c) counting the frequency of said output signal;
   (d) storing the frequency of said output signal;
   (e) applying a sufficient number of clocking pulses to said prescaler to complete the counting cycle of said prescaler;
   (f) counting the number of said clocking pulses;
   (g) storing said count; and
   (h) combining the frequency of said output signal with said count to derive an accurate measure of the frequency of said signal.

3. A method as defined in claim 1 or claim 2 wherein the step of applying a sufficient number of clocking pulses to complete the counting cycle of said prescaler further comprises the steps of:
   (a) applying a second control signal to a bistable device responsive to said prescaler output signal to generate a gating signal;
   (b) applying said gating signal to a logic element;
   (c) generating a signal comprising a plurality of clocking pulses; and
   (d) applying said last-named signal to said logic element.

4. A method as defined in claim 3 further characterized in that:
   (a) said bistable device is a flip flop; and
   (b) said logic element is an AND gate.

5. A method as defined in claim 1 or claim 2 wherein the step of applying a sufficient number of clocking pulses to complete the counting cycle of said prescaler further comprises the steps of:
   (a) applying said signal to a gate;
   (b) controlling the application of said signal to said gate by means of a programmable device;
   (c) sampling the output of said prescaler by means of said programmable device;
   (d) generating a signal responsive to the output of said prescaler by means of said programmable device; and
   (e) applying said signal to said gate.

6. A method as defined in claim 5 further characterized in that:
   (a) said last-named gate is an OR gate; and
   (b) said programmable device is programmable peripheral interface under program control by a microprocessor.

7. A method for deriving the residual count of a prescaler comprising the steps of:
   (a) applying a control signal to a bistable device responsive to the output of said prescaler to generate a gating signal;
   (b) applying said gating signal to a logic element;
   (c) generating a signal comprising a plurality of clocking pulses;
   (d) applying said last-named signal to said logic element to produce an output of pulses to complete the counting cycle of said prescaler; and
   (e) counting said output of pulses from said logic element.

8. A method as defined in claim 7 further characterized in that:
   (a) said bistable device is a flip flop; and
   (b) said logic element is an AND gate.

9. A method as defined in claim 7 wherein the step of applying a sufficient number of clocking pulses to complete the counting cycle of said prescaler further comprises the steps of:
   (a) applying said signal to a gate;
   (b) controlling the application of said signal to said gate by means of a programmable device;
   (c) sampling the output of said prescaler by means of said programmable device;
   (d) generating a signal responsive to the output of said prescaler by means of said programmable device; and
   (e) applying said signal to said gate.

10. A method as defined in claim 9 further characterized in that:
(a) said last-named gate is an OR gate; and
(b) said programmable device is a programmable peripheral interface under program control by a microprocessor.

11. Apparatus for measuring the frequency of a signal comprising, in combination:
(a) a prescaler for accepting said signal and producing an output signal in response thereto;
(b) a first counter adapted to receive said output signal;
(c) means for storing the count of said first counter;
(d) means for applying a sufficient number of clocking pulses to said prescaler to complete the count of said prescaler;
(e) a second counter adapted to receive said clocking pulses;
(f) means for storing the count of said second counter; and
(g) means for combining the counts of said first counter and said second counter to produce an accurate measure of the frequency of said signal.

12. Apparatus as defined in claim 11 further comprising:
(a) means for generating a first control signal of predetermined duration; and
(b) a gate adapted to receive said signal and said first control signal to generate a segment of said signal of predetermined duration for application to said prescaler.

13. Apparatus as defined in claim 12 further comprising:
(a) means for generating a second control signal;
(b) a bistable device adapted to receive said second control signal and the output of said prescaler to generate a gating signal;
(c) a clock for generating a stream of pulses; and
(d) a logic element adapted to receive said gating signal and said stream of pulses.

14. Apparatus as defined in claim 13 further characterized in that:
(a) said bistable device is a flip flop; and
(b) said logic element is an AND gate.

15. Apparatus as defined in claim 11 or claim 12 further comprising:
(a) a programmable device adapted to receive at least one input and to produce at least one output in response thereto;
(b) said programmable device adapted to receive the output of said prescaler to produce an output in response thereto; and
(c) a gate adapted to receive said signal and to receive said last-named output for applying a signal to said prescaler.

16. Apparatus as defined in claim 15 further characterized in that:
(a) said last-named gate is an OR gate; and
(b) said programmable device is a programmable peripheral interface under program control of a microprocessor.

17. A method for deriving the residual count of a prescaler having a predetermined counting cycle after said prescaler has generated an output signal of a value less than said counting cycle comprising the steps of:
(a) applying a sufficient number of clocking pulses thereto to complete the counting cycle of said prescaler; and
(b) counting said clocking pulses.

* * * * *